(12) United States Patent
Saito

(10) Patent No.: US 10,180,878 B2
(45) Date of Patent: Jan. 15, 2019

(54) MEMORY SYSTEM FOR RECORDING DATA AND MEMORY CONTROL METHOD FOR RECORDING DATA

(71) Applicant: Toshiba Memory Corporation, Minato-ku, Tokyo (JP)

(72) Inventor: Toshitada Saito, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 4 days.

(21) Appl. No.: 15/262,346

(22) Filed: Sep. 12, 2016

(65) Prior Publication Data

US 2017/0255513 A1    Sep. 7, 2017

Related U.S. Application Data

(60) Provisional application No. 62/302,929, filed on Mar. 3, 2016.

(51) Int. Cl.
G06F 11/10 (2006.01)
G06F 3/06 (2006.01)
H03M 13/11 (2006.01)
H03M 13/15 (2006.01)

(52) U.S. Cl.
CPC .......... *G06F 11/1068* (2013.01); *G06F 3/064* (2013.01); *G06F 3/0619* (2013.01); *G06F 3/0679* (2013.01); *H03M 13/1102* (2013.01); *H03M 13/152* (2013.01); *H03M 13/1515* (2013.01)

(58) Field of Classification Search
CPC .... G06F 11/1068; G06F 3/0679; G06F 3/064; G06F 3/0619; G11C 29/52; G11C 29/04; G11C 29/44; G11C 29/56008; G11C 2029/4402; H03M 13/2906; G01R 31/318569
USPC ...................................... 714/723
See application file for complete search history.

(56) References Cited

U.S. PATENT DOCUMENTS 8,208,298 B2    6/2012 Kang et al.
2008/0244349 A1*  10/2008 Sukegawa ............ G06F 13/385
                                               714/746

(Continued)

FOREIGN PATENT DOCUMENTS

JP    2004-312133 A    11/2004
JP    2009-016034 A    1/2009
JP    2013-045428 A    3/2013

OTHER PUBLICATIONS

D. C. Huang and H. M. Lin, "A method of correcting the shift error of multilevel flash memory by the skill of gray code," 2011 IEEE International Instrumentation and Measurement Technology Conference, Binjiang, 2011, pp. 1-6.*

*Primary Examiner* — Cynthia Britt
(74) *Attorney, Agent, or Firm* — White & Case LLP

(57) ABSTRACT

A memory system according to an embodiment includes a non-volatile memory that performs multi-value recording using a plurality of pages and a controller. The controller performs bit inversion for any page of first symbols in a data string. The first symbols are a certain code sequence in the data string. The controller dispersedly allocates bits to be inverted to the plurality of pages. The controller records substitution position information indicating a position of the bit inversion in redundant data of the bit-inverted page.

20 Claims, 16 Drawing Sheets

(56) References Cited

U.S. PATENT DOCUMENTS

| | | | | |
|---|---|---|---|---|
| 2010/0251043 A1* | 9/2010 | Anzou | ............... | G11C 29/02 |
| | | | | 714/719 |
| 2012/0137047 A1* | 5/2012 | Hars | ............... | G11C 11/5628 |
| | | | | 711/103 |
| 2013/0151912 A1* | 6/2013 | Sevugapandian | ..... | G06F 11/006 |
| | | | | 714/704 |

* cited by examiner

| Er="0" | A="1" | B="2" | C="3" | D="4" | E="5" | F="6" | G="7" |
|---|---|---|---|---|---|---|---|
| Upper 1 | | | | | 0 | 0 | 1 |
| Middle 1 | 0 | 0 | 0 | 0 | 1 | 1 | 1 |
| Lower 1 | | | | | | | 0 |

FIG.14

| FRAME LENGTH | INVERSION FLAG | REMAINING SINGULAR POINTS: 99.9% | ESTIMATED NUMBER OF bit ERRORS | NUMBER OF bits CONSUMED IN ECC |
|---|---|---|---|---|
| 32 | 128 | 0 | 0.0 | 0 |
| 64 | 64 | 7 | 2.45 | 36 |
| 90 | 46 | 12 | 4.2 | 60 |
| 128 | 32 | 19 | 6.65 | 84 |
| 256 | 16 | 25 | 8.75 | 108 |
| 512 | 8 | 37 | 12.95 | 156 |
| 1024 | 4 | 45 | 15.75 | 192 |
| 4096 | 1 | 54 | 18.9 | 228 |

MEMORY SYSTEM FOR RECORDING DATA AND MEMORY CONTROL METHOD FOR RECORDING DATA

CROSS-REFERENCE TO RELATED APPLICATIONS

This application is based upon and claims the benefit of priority from U.S. Provisional Application No. 62/302,929, filed on Mar. 3, 2016; the entire contents of which are incorporated herein by reference.

FIELD

Embodiments described herein relate generally to a memory system and a memory control method.

BACKGROUND

In a memory element, such as a NAND, a cell is likely to be affected by adjacent cells with the miniaturization of the memory element. Therefore, in some case, data is erroneously read from a cell due to the influence of adjacent cells. In particular, when the memory element performs multi-value recording, in many cases, data is erroneously read from the cell.

BRIEF DESCRIPTION OF THE DRAWINGS

FIG. 14 is a diagram illustrating the relationship between the number of bits of an inversion flag and the number of bits consumed in ECC required for a bit error at remaining singular points;

DETAILED DESCRIPTION

According to an embodiment, a memory system is provided. The memory system includes a non-volatile memory and a controller. The non-volatile memory includes memory cells that perform multi-value recording using a plurality of pages. The controller records data in the non-volatile memory. The controller performs bit inversion for any page of first symbols in a data string. The first symbols are a certain code sequence in the data string. The controller dispersedly allocates bits to be inverted to the plurality of pages. The controller records substitution position information indicating a position of the bit inversion in redundant data of the bit-inverted page.

Hereinafter, a memory system and a memory control method according to embodiments will be described in detail with reference to the accompanying drawings. The invention is not limited by these embodiments.

First Embodiment

Figure 1:
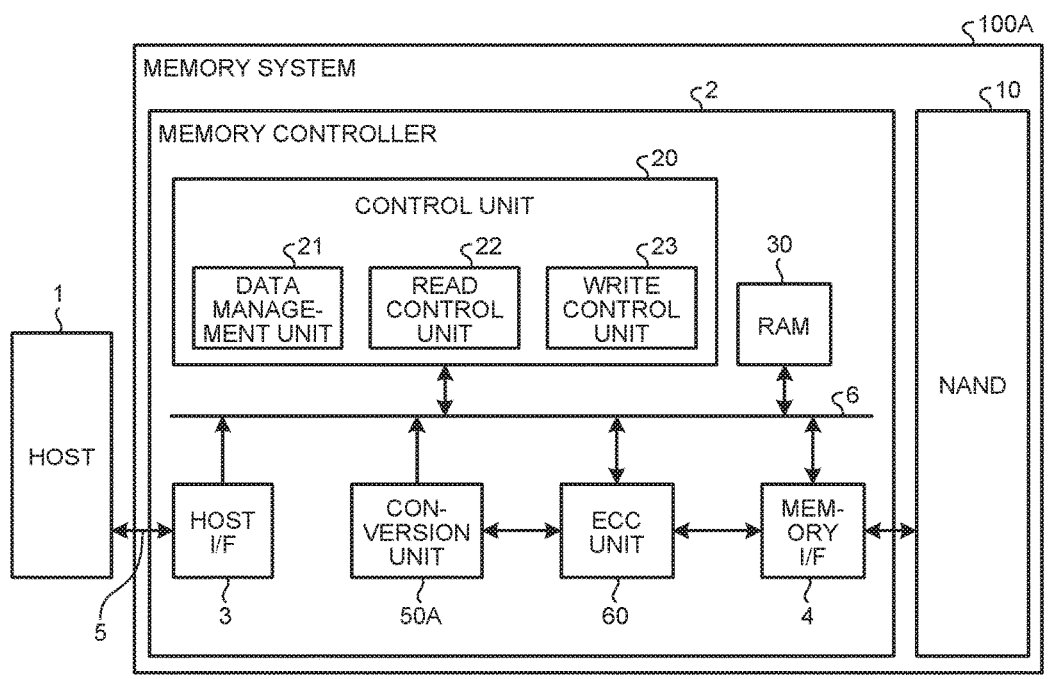
FIG. 1 is a functional block diagram illustrating the internal structure of a memory system according to a first embodiment.

FIG. 1 is a functional block diagram illustrating the internal structure of a memory system according to a first embodiment. A memory system 100A is a device that codes a multi-value memory. The memory system 100A according to this embodiment detects a code and a symbol (a singular point which will be described below) in which an Er to A phenomenon (an error in which a distribution Er is read as a distribution A), which will be described below, is likely to occur and substitutes the code with a substitute code. The memory system 100A adds information about a position where code substitution has been performed (substitution position information which will be described below) as redundant data to page data. In this way, the memory system 100A restores the substituted code, using the substitution position information recorded in the redundant data, during decoding.

The memory system 100A is connected to a host apparatus (hereinafter, abbreviated to a host) 1 by a communication line 5 and functions as an external storage device of the host 1. The host 1 may be, for example, an information processing apparatus, such as a personal computer, a mobile phone, or an imaging apparatus, or may be a portable terminal, such as a tablet computer or a smart phone. The host 1 may be a game machine or an in-vehicle terminal such as a car navigation system.

The memory system 100A includes a NAND flash memory (hereinafter, abbreviated to a NAND) 10 as a non-volatile memory and a memory controller 2. The non-volatile memory is not limited to the NAND flash memory and may be, for example, a three-dimensional flash memory, a resistance random access memory (ReRAM), or a ferroelectric random access memory (FeRAM).

The NAND 10 includes one or more memory chips each of which has a memory cell array. The memory cell array includes a plurality of memory cells which are arranged in a matrix. The memory cell array includes a plurality of blocks each of which is the unit of data erase. Each block includes a plurality of physical sectors MS (see FIG. 2). The structure of the memory cell array assumed in this embodiment is not particularly limited and may be a two-dimensional memory cell array illustrated in FIG. 2, a three-dimensional memory cell array, or other memory cell arrays.

Figure 2:
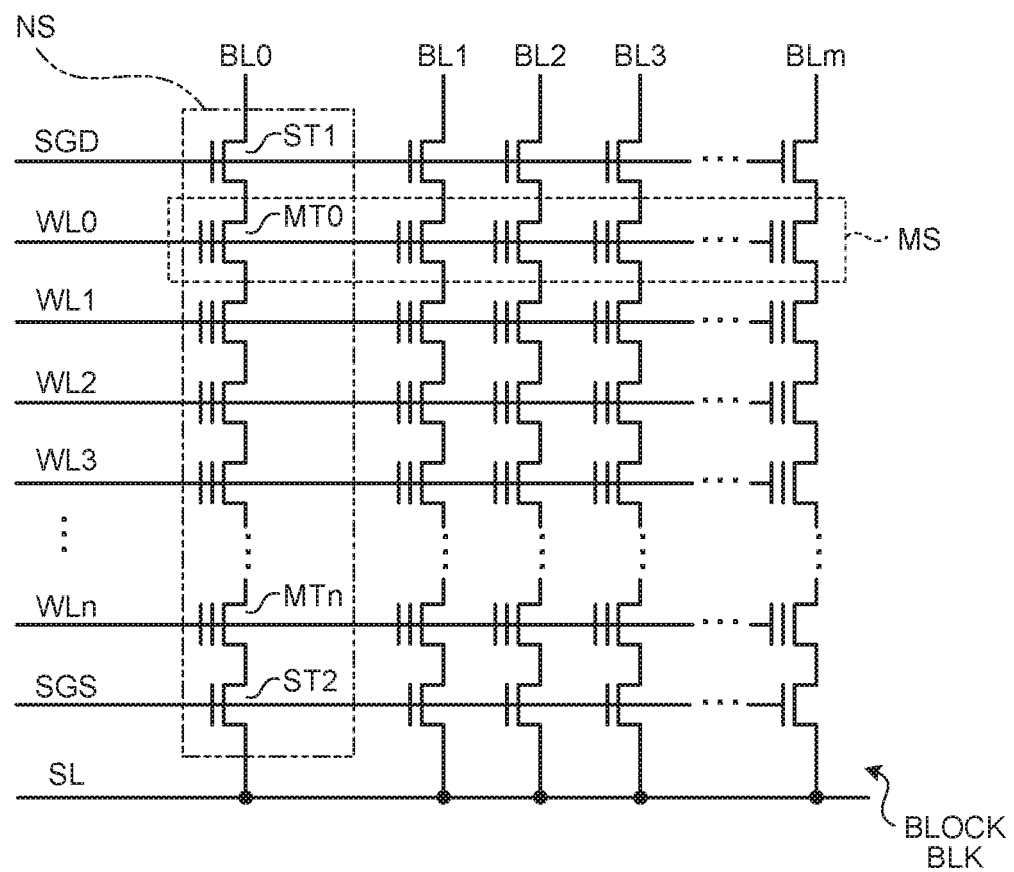
FIG. 2 is a diagram illustrating an example of the structure of a block in a two-dimensional memory cell array.

FIG. 2 is a diagram illustrating an example of the structure of the block in the two-dimensional memory cell array. FIG. 2 illustrates one block among a plurality of blocks forming the two-dimensional memory cell array. The other blocks of the memory cell array have the same structure as that illustrated in FIG. 2. As illustrated in FIG. 2, a block BLK of the memory cell array includes (m+1) (m is an integer that is equal to or greater than 0) NAND strings NS. Each NAND string NS includes (n+1) (n is an integer that is equal to or greater than 0) memory cell transistors MT0 to MTn in which adjacent memory cell transistors MT share a diffusion region (a source region or a drain region) and are connected in series to each other and select transistors ST1 and ST2 which are provided at both ends of a column of (n+1) memory cell transistors MT0 to MTn.

Word lines WL0 to WLn are connected to control gate electrodes of the memory cell transistors MT0 to MTn forming the NAND string NS, respectively, and memory cell transistors MTi (i=0 to n) in each NAND string NS are connected to the same word line WLi (i=0 to n). That is, the control gate electrodes of the memory cell transistors MTi in the same row in the blocks BLK are connected to the same word line WLi.

Each of the memory cell transistors MT0 to MTn is a field effect transistor having a stacked gate structure which is formed on a semiconductor substrate. Here, the stacked gate structure includes a charge storage layer (floating gate electrode) that is formed on the semiconductor substrate, with a gate insulating film interposed therebetween, and a control gate electrode that is formed on the charge storage layer, with a gate insulating film interposed therebetween. The threshold voltages of the memory cell transistors MT0 to MTn vary depending on the number of electrons stored in a floating gate electrode and the memory cell transistors MT0 to MTn can store data according to the difference between the threshold voltages.

Bit lines BL0 to BLm are connected to the drains of (m+1) select transistors ST1 in one block BLK and a common select gate line SGD is connected to the gates of the (m+1) select transistors ST1. In addition, the source of the select transistor ST1 is connected to the drain of the memory cell transistor MT0. Similarly, a common source line SL is connected to the sources of (m+1) select transistors ST2 in one block BLK and a common select gate line SGS is connected to the gates of the (m+1) select transistors ST2. The drain of the select transistor ST2 is connected to the source of the memory cell transistor MTn.

Each memory cell is connected to the word line and the bit line. Each memory cell can be identified by an address for identifying the word line and an address for identifying the bit line. As described above, data in the memory cells (memory cell transistors MT) in the same block BLK is collectively erased. In contrast, the reading and writing of data are performed for each physical sector MS. One physical sector MS includes a plurality of memory cells connected to one word line.

Each memory cell can store multi-value data. When the memory cell is operated in a single-level cell (SLC) mode, one physical sector MS corresponds to one page. When the memory cell is operated in a multi-level cell (MLC) mode, one physical sector MS corresponds to N pages (N is a natural number equal to or greater than 2). In the specification, the term "MLC mode" includes a triple-level cell (TLC) mode in which N is 3 and a quadruple-level cell (QLC) mode in which N is 4. In this embodiment, a case in which the memory cell is operated in the TLC mode will be described.

During a read operation and a program operation, one word line is selected and one physical sector MS is selected according to a physical address. Pages in the physical sector MS are switched by the physical address.

In FIG. 1, for example, user data which is transmitted from the host 1, the management information of the memory system 100A, and firmware (not illustrated) are stored in the NAND 10. The firmware operates a CPU (not illustrated) which implements at least some of the functions of a control unit 20 in the memory controller 2. The firmware may be stored in a ROM (not illustrated). The management information includes, for example, a logical/physical translation table.

The memory controller 2 includes a host interface 3, a memory interface 4, a control unit 20, a RAM 30, a conversion unit 50A, and an ECC unit 60. In this embodiment, the RAM 30 is provided in the memory controller 2. However, the RAM 30 may be provided outside the memory controller 2. The host I/F 3 performs a process according to an interface standard with the host 1 and outputs, for example, commands and user data (write data) received from the host 1 to an internal bus 6. In addition, the host I/F 3 transmits, for example, user data read from the NAND 10 and a response from the control unit 20 to the host 1. The memory I/F 4 directly controls the NAND 10 on the basis of an instruction from the control unit 20.

The RAM 30 is a volatile semiconductor memory having a higher access speed than the NAND 10. The RAM 30 includes a storage area as a data buffer. Data received from the host 1 is temporarily stored in the RAM 30 before it is written to the NAND 10. Data which is read from the NAND 10 is temporarily stored in the RAM 30 before it is transmitted to the host 1. The management information stored in the NAND 10 is loaded to the RAM 30. The management information loaded to the RAM 30 is backed up by the NAND 10. The RAM 30 also functions as a buffer to which firmware stored in the NAND 10 is loaded. For example, a static random access memory (SRAM) or a dynamic random access memory (DRAM) is used as the RAM 30.

The control unit 20 comprehensively controls each component of the memory system 100A. The control unit 20 includes a data management unit 21, a read control unit 22, and a write control unit 23. The functions of the control unit 20 are implemented by one or a plurality of CPUs (processors) which execute the firmware loaded to the RAM 30 and peripheral circuits. The functions of the data management unit 21 are implemented by a CPU which executes the firmware and/or hardware. The functions of the read control unit 22 are implemented by a CPU which executes the firmware and/or hardware. The functions of the write control unit 23 are implemented by a CPU which executes the firmware and/or hardware.

The data management unit 21 manages user data, using a logical/physical translation table which is one of the management information items loaded to the RAM 30. Mapping between a logical address used by the host 1 and the physical address of the RAM 30 or the NAND 10 is registered in the logical/physical translation table. For example, a logical block addressing (LBA) is used as the logical address. The physical address indicates a storage position where data is stored in the RAM 30 or the NAND 10.

The write control unit 23 performs a process for writing data to the NAND 10 in response to a write command which is notified from the host 1 through the host I/F 3. For example, when receiving a write request from the host 1, the write control unit 23 acquires a physical position where data is to be written in the NAND 10 from the data management unit 21 and outputs the physical position and a code word output from the ECC unit 60 to the memory I/F 4.

The read control unit 22 performs a control process for reading data from the NAND 10 in response to a read command which is notified from the host 1 through the host I/F 3. For example, the read control unit 22 acquires a physical position which corresponds to the logical address of the read data in the NAND 10 from the data management unit 21 and notifies the memory I/F 4 of the physical position.

The conversion unit 50A performs bit inversion for a position (singular point) (singularities) where an erroneous data value is read due to the sequence of a data string stored in the memory cells when data is read from the memory cells, thereby removing the singular point. When the memory cell includes an upper page (hereinafter, referred to as a U page), a lower page (hereinafter, referred to as an L page), and a middle page (hereinafter, referred to as an M page), the conversion unit 50A equally inverts the bits of the U page, the L page, and the M page.

When performing a process of inverting the bits of the singular point, the conversion unit 50A places substitute position information (syndrome information) indicating a bit inversion position as a portion of redundant data in a tail end region of a data string of the same page in order to record the position where bit inversion has been performed. In this embodiment, the conversion unit 50A disperses bit inversion to each page. In other words, the conversion unit 50A dispersedly allocates bits to be inverted (the number of bits to be inverted) to a plurality of pages. That is, the conversion unit 50A does not allocate all of the bits to be inverted to only one page. The conversion unit 50A allocates a certain percentage (P %: 0<P<100) of the bits to be inverted to the U page, allocates a certain percentage (Q %: 0<Q<100) of the bits to be inverted to the L page, and allocates a certain percentage (R %: 0<R<100) of the bits to be inverted to the M page. In this case, P+Q+R=100 is established.

The conversion unit 50A sets at which page the bits are inverted as a process of allocating the bits to be inverted. Specifically, when inverting the bits of the singular point, the conversion unit 50A sets at which page the bits are inverted. When there are a plurality of singular points, the conversion unit 50A sets at which page the bits are inverted for each singular point. The setting process is an inversion bit allocation process.

For example, the conversion unit 50A equally allocates the bits to be inverted to each page (one third of the bits are allocated to the U page, one third of the bits are allocated to the M page, and one third of the bits are allocated to the L page) to reduce the amount of necessary redundant data. Specifically, the conversion unit 50A allocates substantially the same number of bits to be inverted to the U page, the M page, and the L page. Therefore, the number of bit inversion processes performed in the U page, the number of bit inversion processes performed in the M page, and the number of bit inversion processes performed in the L page are substantially equal to each other. The functions of the conversion unit 50A are implemented by a CPU that executes firmware and/or hardware. The CPU that implements the functions of the conversion unit 50A is provided in the control unit 20.

The ECC unit 60 performs an error correction coding process for data which is transmitted from the conversion unit 50A to generate ECC data. The ECC unit 60 outputs a code word including the data and the ECC data to the memory I/F 4. The memory I/F 4 inputs a code word which is read from the NAND 10 to the ECC unit 60. The ECC unit 60 performs an error correction decoding process, using the input code word, and outputs the decoded data to the conversion unit 50A. The functions of the ECC unit 60 are implemented by a CPU that executes firmware and/or hardware. The CPU that implements the functions of the ECC unit 60 is provided in the control unit 20.

The ECC unit 60 may use any coding method. For example, Reed Solomon (RS) coding, Bose Chaudhuri Hocquenghem (BCH) coding, and low-density parity-check (LDPC) coding can be used.

When receiving a write request from the host 1, the memory system 100A operates as follows. The write control unit 23 temporarily stores write data in the RAM 30. The write control unit 23 reads data stored in the RAM 30 and inputs the read data to the conversion unit 50A. The conversion unit 50A inverts the bits of at least one of the U page, the M page, and the L page at the singular point and outputs the bits to the ECC unit 60. The ECC unit 60 encodes the input data and inputs a code word to the memory I/F 4. The memory I/F 4 writes the input code word to the NAND 10.

When a read request is received from the host 1, the memory system 100A operates as follows. The memory I/F 4 inputs a code word which is read from the NAND 10 to the ECC unit 60. The ECC unit 60 decodes the input code word and inputs the decoded data to the conversion unit 50A. The conversion unit 50A performs conversion which is reverse to that performed when data is written and stores the converted data in the RAM 30. The read control unit 22 transmits the data stored in the RAM 30 to the host 1 through the host I/F 3.

Figure 3:
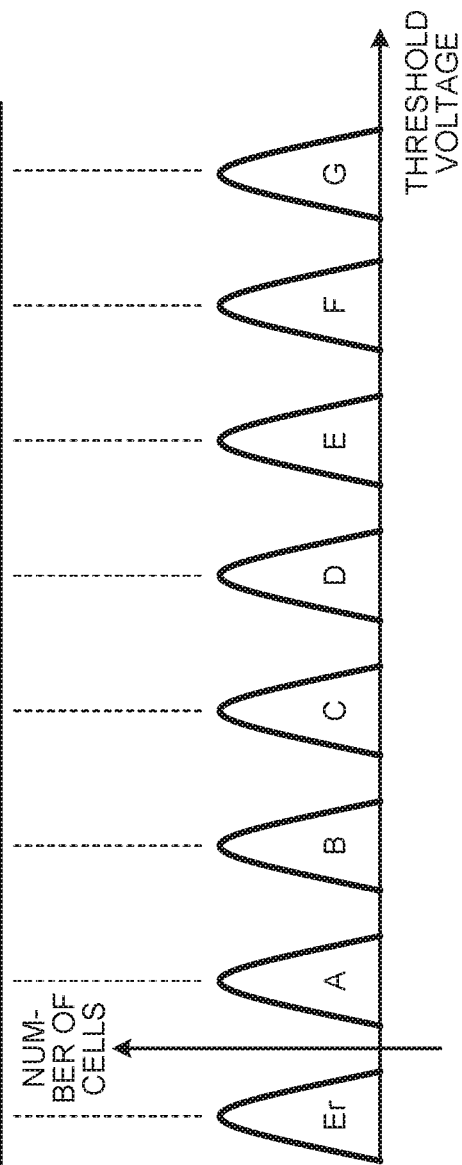
FIG. 3 is a diagram illustrating an example of a threshold voltage distribution of a 3-bit memory cell and data coding.

FIG. 3 is a diagram illustrating an example of a threshold voltage distribution of a 3-bit memory cell and data coding. In a lower part of FIG. 3, the horizontal axis indicates a threshold voltage and the vertical axis indicates the number of memory cells. As illustrated in the lower part of FIG. 3, a 3-bit memory cell has eight distributions, that is, a distribution Er, a distribution A, a distribution B, a distribution C, a distribution D, a distribution E, a distribution F, and a distribution G. The distribution Er has the lowest threshold voltage and corresponds to a threshold voltage distribution in an erase state. The threshold voltage increases in the order of the distribution A, the distribution B, the distribution C, the distribution D, the distribution E, the distribution F, and the distribution G. The distribution G has the highest threshold voltage.

When a 3-bit memory cell is used, a 3-bit data value corresponds to each of the eight threshold distributions Er, A, B, C, D, E, F, and G. This correspondence is referred to as data coding. The data coding is predetermined. When data is written (program), charge is injected into the memory cell such that a threshold voltage distribution corresponding to the data value to be stored is obtained, according to the data coding. When 3 bits/cell are used, one physical sector corresponds to three pages. 3 bits which can be stored in each memory cell correspond to three pages. In this embodiment, the three pages are a lower page, a middle page, and an upper page.

An upper part of FIG. 3 is a diagram illustrating an example of the data coding. As illustrated in the upper part of FIG. 3, the distribution Er corresponds to a data value of "111", the distribution A corresponds to a data value of "101", the distribution B corresponds to a data value of "100", the distribution C corresponds to a data value of "000", the distribution D corresponds to a data value of "001", the distribution E corresponds to a data value of "011", the distribution F corresponds to a data value of "010", and the distribution G corresponds to a data value of "110". In this embodiment, when Du is data of the U page, Dm is the data of the M page, and Dl is data of the L page, a 3-bit data value is represented by "DuDmDl". The data coding illustrated in FIG. 3 is illustrative. The data coding is not limited to the example illustrated in FIG. 3. First to seventh read voltages are set between the distributions Er and A, between the distributions A and B, between the distributions B and C, between the distributions C and D, between the distributions D and E, between the distributions E and F, and between the distributions F and G, respectively. The first to seventh read voltages are voltages for determining the data value of any one of the L page, the M page, and the U page.

In a flash memory, as the number of repetitions of the reciprocation between a write state (distributions A to G) and an erase state (distribution Er) increases, the number of electrons which pass through an oxide film of the memory cell increases. As a result, the flash memory is impoverished. In addition, as the number of times data is written to the distributions E, F, and G having a high threshold voltage increases, the interference between adjacent memory cells increases and the probability of the symbol causing a read error increases.

This phenomenon is caused by the interference between adjacent cells which occurs due to an increase in the amount of leakage current with the miniaturization of cells or a reduction in the rate of increase in write prohibition potential in a memory cell channel during a write operation. The interference between adjacent cells is a phenomenon in which, when there is a large difference in threshold voltage between adjacent cells, capacitive coupling occurs between adjacent cells and the threshold voltage of the cell with a low threshold voltage increases. The interference between adjacent cells causes the threshold voltage of the memory cell with the distribution Er to increase to the adjacent distribution A. As a result, there is a concern that an erroneous data value will be read during a read operation. Hereinafter, in the specification, this phenomenon is referred to as an Er to A phenomenon (Er-A error).

In the following description, in some cases, the distribution X is referred to as "X". That is, in some cases, the distribution Er, the distribution A, the distribution B, the distribution C, the distribution D, the distribution E, the distribution F, and the distribution G are referred to as "Er", "A", "B", "C", "D", "E", "F", and "G", respectively.

Figures 4, 5:
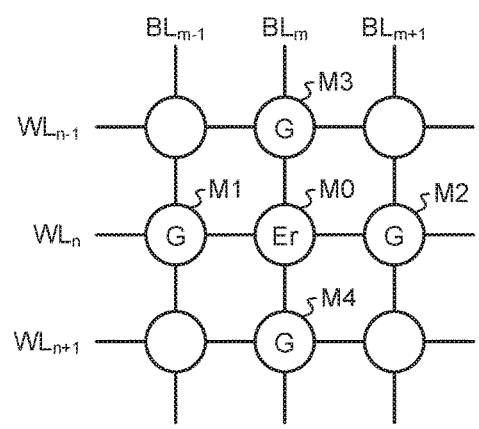
FIG. 4 is a diagram illustrating an Er to A phenomenon.
FIG. 5 is a diagram illustrating a singular point substitution process.

FIG. 4 is a diagram illustrating the Er to A phenomenon. FIG. 4 illustrates the arrangement pattern of the threshold voltage distributions of adjacent cells in which the Er to A phenomenon is most noticeable. A memory cell M0 illustrated in FIG. 4 belongs to the distribution Er having the lowest threshold voltage. The memory cell M0 is affected by cells M1 and M2 which are adjacent in the direction of the word line and cells M3 and M4 which are adjacent in the direction of the bit line. All of the adjacent cells M1, M2, M3, and M4 belong to the distribution G having the highest threshold voltage and the memory cell M0 is surrounded by the adjacent cells M1, M2, M3, and M4 belonging to the distribution G. As such, in the case of the 3-bit memory cell, a state in which the memory cell M0 is surrounded by the adjacent cells M1, M2, M3, and M4 belonging to the distribution G is the arrangement pattern of the threshold voltage distributions in which the Er to A phenomenon is most noticeable. In the following description, for ease of explanation, the Er to A phenomenon between the memory cell M0 and the cells M1 and M2 which are adjacent to the memory cell M0 in the lateral direction will be described.

In this embodiment, the symbol of a code sequence in which the Er to A phenomenon is noticeable is referred to as a singular point. The symbol is information (for example, a numerical value or a symbol) indicated by each cell. Since the symbol corresponds to a threshold voltage distribution, it also corresponds to information allocated to the threshold voltage distribution.

In the case of a 3-bit memory cell, the symbol is associated with any one of the distribution Er, the distribution A, the distribution B, the distribution C, the distribution D, the distribution E, the distribution F, and the distribution G. In the case of a 2-bit memory cell, the symbol is associated with any one of the distribution Er, the distribution A, the distribution B, and the distribution C. In the case of an X-bit (X is a natural number) memory cell, the symbol is associated with any one of $2^x$ types of distributions.

When the singular point is extracted, the conversion unit 50A allocates values to each symbol such that, for example, the distribution Er=0, the distribution A=1, the distribution B=2, the distribution C=3, the distribution D=4, the distribution E=5, the distribution F=6, and the distribution G=7 are established. The values which are allocated to each symbol by the conversion unit 50A are not limited to the above. The conversion unit 50A may allocate different values to the distributions (threshold voltages). For example, the conversion unit 50A allocates a value corresponding to the level of the threshold voltage to each distribution.

The conversion unit 50A calculates the difference between the values of adjacent symbols (hereinafter, referred to as an adjacent difference). The adjacent difference is the difference between the value allocated to the symbol of the memory cell M0 and the value allocated to the symbol of the adjacent cell M1. Since the threshold voltage (distribution) corresponds to the symbol, the adjacent difference corresponds to the difference in threshold voltage between adjacent memory cells.

The adjacent difference corresponds to the probability of a read error occurring. Therefore, the probability of a read error occurring is higher between the distributions (memory cells) having a larger adjacent difference therebetween. The conversion unit 50A calculates the adjacent difference. For example, the adjacent difference between the distributions G and Er is 7 and the adjacent difference between the distributions F and Er is 6. In this embodiment, a point at which the sum of the adjacent differences between three adjacent symbols is equal to or greater than 12 is defined as the singular point. Therefore, a point at which the sum of the adjacent difference between the memory cell M0 and the adjacent cell M1 and the adjacent difference between the memory cell M0 and the adjacent cell M2 is equal to or greater than 12 is the singular point. In addition, a point at which the sum of the adjacent differences is equal to or greater than 13 or equal to or less than 11 may be defined as the singular point. The singular point is not limited to the above-mentioned definition. A symbol where the probability of a read error occurring is greater than a certain value or a symbol where the probability is equal to or greater than the certain value may be defined as the singular point. A symbol string (code sequence) in which the probability of a read error occurring is greater than a certain value or a symbol string in which the probability is equal to or greater than the certain value may be defined as the singular point. A certain symbol string among 512 (=8×8×8) symbol strings may be defined as the singular point.

When the symbol string is G-Er-G, the sum of the adjacent differences is 14. When the symbol string is G-Er-F or F-Er-G, the sum of the adjacent differences is 13. When the symbol string is G-Er-E, F-Er-F, or E-Er-G, the sum of the adjacent differences is 12. When the symbol string is G-A-G, the sum of the adjacent differences is 12. Therefore, in this embodiment, the symbol string G-A-G is also counted as the singular point.

The number of types of symbol strings is the number of combinations of three consecutive symbols and is 512 (=8×8×8). There are seven singular points, that is, G-Er-G, G-Er-F, F-Er-G, G-Er-E, F-Er-F, E-Er-G, and G-A-G.

For example, it is assumed that each page is a data string (each of the upper page, the middle page, and the lower pages is a 4096-bit string) including 4096 symbols. The data string having 4096 symbols is divided into N (N is a natural number) symbol strings and one symbol string (a data string having a symbol length of 4096/N) is referred to as a frame. It is preferable that N be the power of 2 that is equal to or less than 4096 in order to make the frames have the same symbol length. However, the restrictions are not necessarily required and the data string may be divided into frames with substantially the same symbol length.

In the memory system 100A, when data is stored in each page, without any change, the singular point is likely to be appeared. Therefore, the conversion unit 50A of the memory system 100A inverts the bit of the U page, the L page, or the M page of the singular point to remove the singular point. Hereinafter, the process of removing the singular point using bit inversion is referred to as a singular point substitution process or a substitution process. The bit inversion is a process which changes (substitutes) a value indicated by a bit to another value. For example, when a bit indicates "1" or "0", "1" is replaced with "0" and "0" is replaced with "1" by bit inversion. In other words, the bit inversion is a process which changes a first value set (allocated) to the bit to a second value. Specifically, the number of electrons stored in a floating gate electrode is changed by bit inversion. Then, the threshold voltage of the bit is changed from a first voltage to a second voltage.

FIG. 5 is a diagram illustrating the singular point substitution process. When the singular point is an Er code, three inversion methods, that is, U bit inversion, M bit inversion, and L bit inversion can be selected in the singular point substitution process. The U bit inversion substitutes (converts) "Er" with "E". The M bit inversion substitutes "Er" with "A". The L bit inversion substitutes "Er" with "G". In other words, the U bit inversion is bit inversion (U inversion) for the U page of "Er", the M bit inversion is bit inversion (M inversion) for the M page of "Er", and the L bit inversion is bit inversion (L inversion) for the L page of "Er".

When the substitution process is performed, the conversion unit 50A places substitution position information (syndrome information) indicating a bit inversion position as a portion of the redundant data in a tail end region of the data string in order to record the position where bit inversion has been performed. In order to record the position where bit inversion has been performed, 12 bits for a total data length of 4096 bits are needed, similarly to the syndrome in ECC.

A redundant data portion of the same page as that in which bit inversion has been performed is used to record the syndrome. The data subjected to bit inversion by the substitution process can be determined with reference to the redundant data of the page. When data is read, the ECC unit 60 can independently perform decoding processes for the U page, the M page, and the L page. The singular point substitution process can invert the bit of any one of the U page, the M page, and the L page. The conversion unit 50A can equally allocate the bits to be inverted to each page (one third of the bits are allocated to the U page, one third of the bits are allocated to the M page, and one third of the bits are allocated to the L page) to reduce the amount of necessary redundant data.

Figure 6:
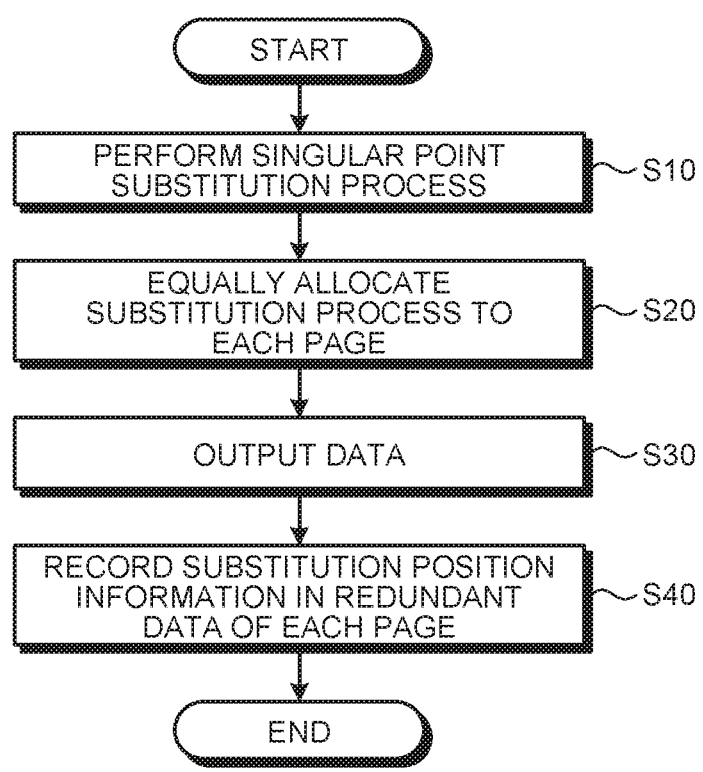
FIG. 6 is a flowchart illustrating the procedure of a singular point substitution process according to the first embodiment.

FIG. 6 is a flowchart illustrating the procedure of the singular point substitution process according to the first embodiment. When a data write request is received from the host 1, the conversion unit 50A divides data input from the host 1 into frames.

In addition, the conversion unit 50A extracts a singular point from each frame. Then, the conversion unit 50A performs the substitution process for the extracted singular point (Step S10). In this case, the conversion unit 50A equally performs the substitution process, which is bit inversion, to each page (Step S20). Specifically, the conversion unit 50A performs one third of the singular point substitution process to each of the U page, the M page, and the L page. That is, the conversion unit 50A performs the singular point substitution process such that the number of U bit inversion processes, the number of M bit inversion processes, and the number of L bit inversion processes are substantially equal to each other. Then, the conversion unit 50A performs the same number of substitution processes for the U page, the M page, and the L page.

Then, the conversion unit 50A generates substitution position information indicating the position (bit position) where bit inversion has been performed. Then, the conversion unit 50A outputs the data (both the frame data to be substituted and data which is not to be substituted) subjected to the substitution process and the substitution position information to the ECC unit 60 (Step S30).

The ECC unit 60 performs an error correction coding process for the data transmitted from the conversion unit 50A to generate ECC data. In this embodiment, since the conversion unit 50A performs the substitution process, the number of error bits corrected by ECC is less than that when the substitution process is not performed.

The ECC unit 60 inputs the coded data, the substitution position information, and the ECC data to the memory I/F 4. The conversion unit 50A may input the substitution position information to the memory I/F 4.

The memory I/F 4 writes the coded data, the substitution position information, and the ECC data to each page of the NAND 10. In this case, the memory I/F 4 records the coded data (U page data 51U, M page data 51M, and L page data 51L which will be described below) at the head of the page. In addition, the memory I/F 4 records the substitution position information and the ECC data as a portion of redundant data 61A in a tail end region of the data string of each page (Step S40). The substitution position information may be stored in a region other than the tail end region.

When a data read request is received from the host 1, the conversion unit 50A performs a substitution process which is reverse to that performed when data is written, on the basis of substitution position information items 52U, 52M, and 52L. Specifically, the conversion unit 50A converts the data subjected to U bit inversion from "E" to "Er". In addition, the conversion unit 50A converts the data subjected to M bit inversion from "A" to "Er" and converts the data subjected to L bit inversion from "G" to "Er".

Figure 7:
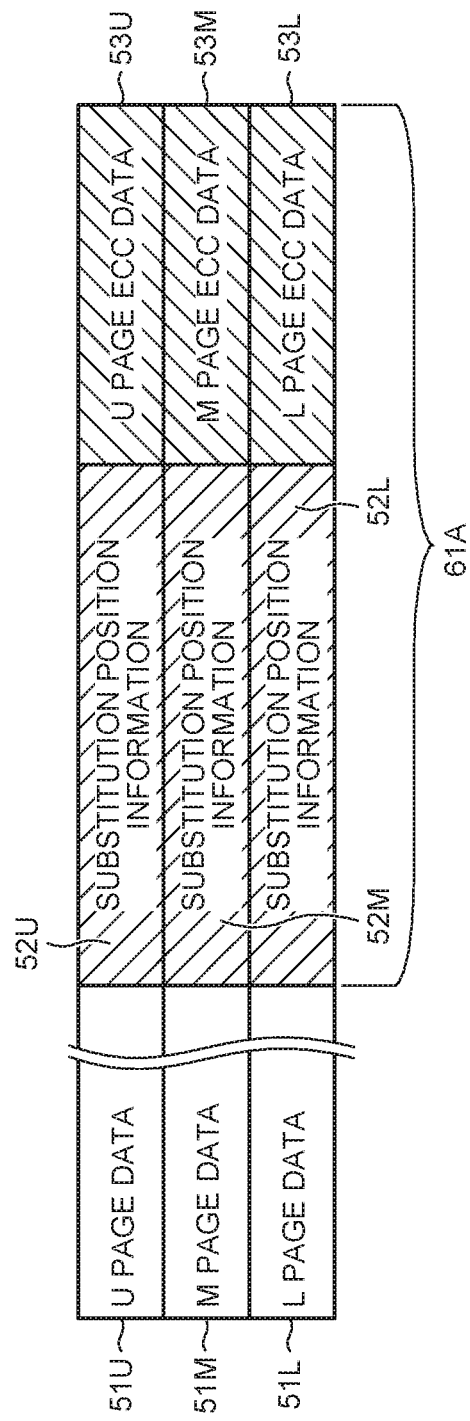
FIG. 7 is a diagram illustrating an example of the structure of pages according to the first embodiment.

FIG. 7 is a diagram illustrating an example of the structure of pages according to the first embodiment. The U page data 51U, the M page data 51M, and the L page data 51L are obtained by the conversion process (substitution process) of the conversion unit 50A. In addition, U page ECC data 53U, M page ECC data 53M, and L page ECC data 53L are ECC data for a U page, ECC data for an M page, and ECC data for an L page, respectively.

The U page data 51U, the substitution position information 52U of the U page, and the U page ECC data 53U are written to the U page of the NAND 10. In addition, the M page data 51M, the substitution position information 52M of the M page, and the M page ECC data 53M are written to the M page of the NAND 10. The L page data 51L, the substitution position information 52L of the L page, and the L page ECC data 53L are written to the L page of the NAND 10.

The redundant data 61A is placed at the tail end of each page. In this embodiment, the substitution position information items 52U, 52M, and 52L, the U page ECC data 53U, the M page ECC data 53M, and the L page ECC data 53L are written to the redundant data 61A. Specifically, the substitution position information 52U and the U page ECC data 53U are recorded in a region in which the redundant data 61A is placed in the U page. In addition, the substitution position information 52M and the M page ECC data 53M are recorded in a region in which the redundant data 61A is placed in the M page. The substitution position information 52L and the L page ECC data 53L are recorded in a region in which the redundant data 61A is placed in the L page.

The singular point substitution process can invert the bit of any one of the U page, the M page, and the L page. In this embodiment, the singular point substitution process is divided into three parts and is performed to the U page, the M page, and the L page. In other words, one third of the singular point substitution process is performed to the U page, one third of the singular point substitution process is performed to the M page, and one third of the singular point substitution process is performed to the L page. Therefore, the substitution position information items 52U, 52M, and 52L have substantially the same amount of data and it is possible to reduce the amount of data required for the redundant data 61A. In addition, the number of ECC codes for each page is reduced by one third of the number of singular points. As a result, it is possible to suppress the consumption of the redundant data 61A for the singular point.

Figure 8:
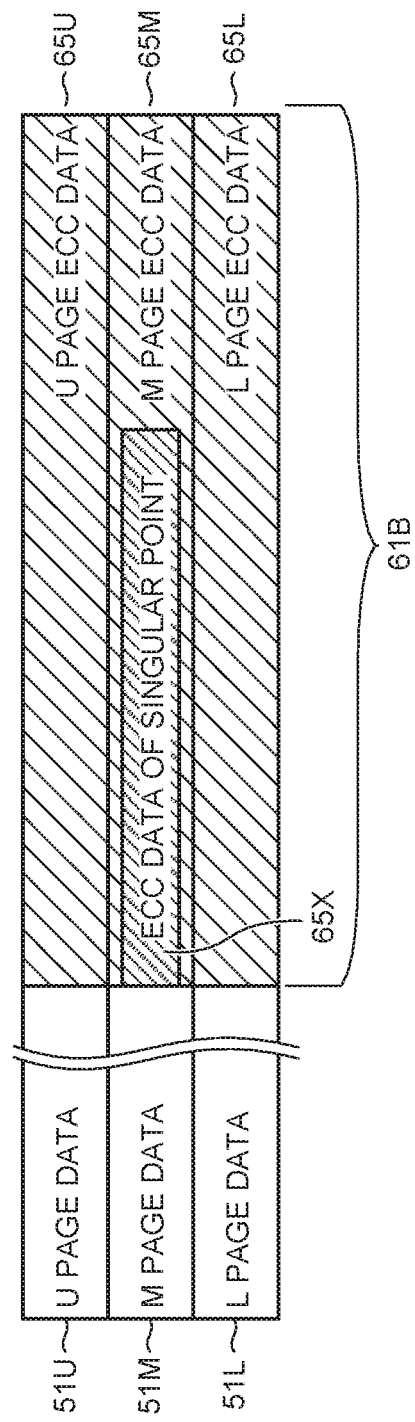
FIG. 8 is a diagram illustrating an example of the structure of pages when all of bit errors caused by the Er to A phenomenon at a singular point are processed by ECC for an M page.

However, in the memory system 100A, the Er to A phenomenon occurs in a certain percentage of singular points among the singular points included in the data string, which causes a bit error. If the Er to A phenomenon occurs in about 35% of the singular points, a bit error caused by the Er to A phenomenon occurs in the M page. In this case, there is a method that generates the Er to A phenomenon, which occurs in about 35% of the singular points appeared in the data string, as all of the bit errors and processes the phenomenon using ECC for the M page. FIG. 8 is a diagram illustrating an example of the structure of pages when all of the bit errors caused by the Er to A phenomenon at the singular point are processed by ECC for the M page.

When all of the singular points are processed by ECC for the M page, the U page data 51U and U page ECC data 65U are written to the U page and the L page data 51L and L page ECC data 65L are written to the L page. In addition, the M page data 51M and M page ECC data 65M are written to the M page. The M page ECC data 65M includes ECC data 65X of the singular point. The amount of ECC data 65X of the singular point indicates the amount of data which is used for ECC for the singular point in the M page ECC data 65M.

In this case, the U page ECC data 65U, the M page ECC data 65M, and the L page ECC data 65L are written to redundant data 61B. The amount of ECC data 65X of the singular point is more than the amount of data in the substitution position information 52U. Then, a large amount of redundant data 61B is consumed in order to store the ECC data 65X of the singular point.

In contrast, it is not necessary to store the ECC data 65X of the singular point in the above-mentioned redundant data 61A. Therefore, ECC using the redundant data 61A has a higher error correction capability than ECC using the redundant data 61B.

The number of bit errors at the singular point is reduced by the substitution process. In addition, bit errors occur in a certain percentage (for example, 35%) of singular points which have not been subjected to the substitution process among the singular points. The bit errors which occur in the data are corrected by ECC.

When the singular point substitution process is not performed, ECC data which corresponds to 35% of the M page is consumed in the redundant data 61B. On the other hand, when the singular point substitution is performed, substitution position information corresponding to one third of the singular point is stored in the redundant data 61A. Therefore, when the singular point substitution process is performed, it is possible to suppress the consumption of the redundant data 61A.

As such, the memory system 100A substitutes the singular point with a substitute code to suppress the occurrence of a read error while suppressing the consumption of the redundant data 61A. Therefore, it is possible to effectively prevent the deterioration of error correction capability caused by the Er to A phenomenon. In addition, even if the frequency of occurrence of a read error (Er to A error) caused by the Er to A phenomenon is increased by the wear of the NAND 10, it is possible to maintain error correction capability. In addition, parameters are dynamically changed, depending on the degree of wear of the NAND 10, which makes it possible to increase the lifespan of the NAND 10.

When the symbol string is a symbol sequence, such as G-Er-G-Er-G, in which singular points are continuously appeared, the conversion unit 50A may not substitute "Er", but may substitute "G" which is interposed between the singular points. In this case, consecutive singular points are removed by the substitution of one singular point. Therefore, it is possible to reduce the number of substitution processes for consecutive singular points. In addition, when there are consecutive singular points, in some cases, the code to be substituted is "F" and "E", in addition to "G", or the singular point is not "Er", but is "A". In this case, the conversion unit 50A selects a substitution target (symbol) such that the singular point is removed by bit inversion.

According to the first embodiment, the singular point substitution process is substantially equally performed to the U page, the M page, and the L page. In addition, the substitution position information items 52U, 52M, and 52L are written to the U page, the M page, and the L page, respectively, such that they have substantially the same amount of data. As such, during code substitution, the singular points are equally performed to the U page, the M page, and the L page. At the time of substitution, the substitution position information is stored in the page in which bit inversion has been performed. Therefore, it is possible to reduce the number of read errors caused by the Er to A phenomenon while suppressing the consumption of the amount of redundant data 61A used to restore data in the NAND 10.

Second Embodiment

Next, a second embodiment will be described with reference to FIGS. 9 and 10. In the second embodiment, a substitution process which inverts bits of a U page and an L page is performed for a certain percentage of singular points. Then, among the remaining singular points, the singular points which cause bit errors are corrected by ECC. The singular point substitution process and the ECC process are optimally allocated. In other words, either the singular point substitution process or the ECC process is suitably chosen to be performed on the singular points.

Figure 9:
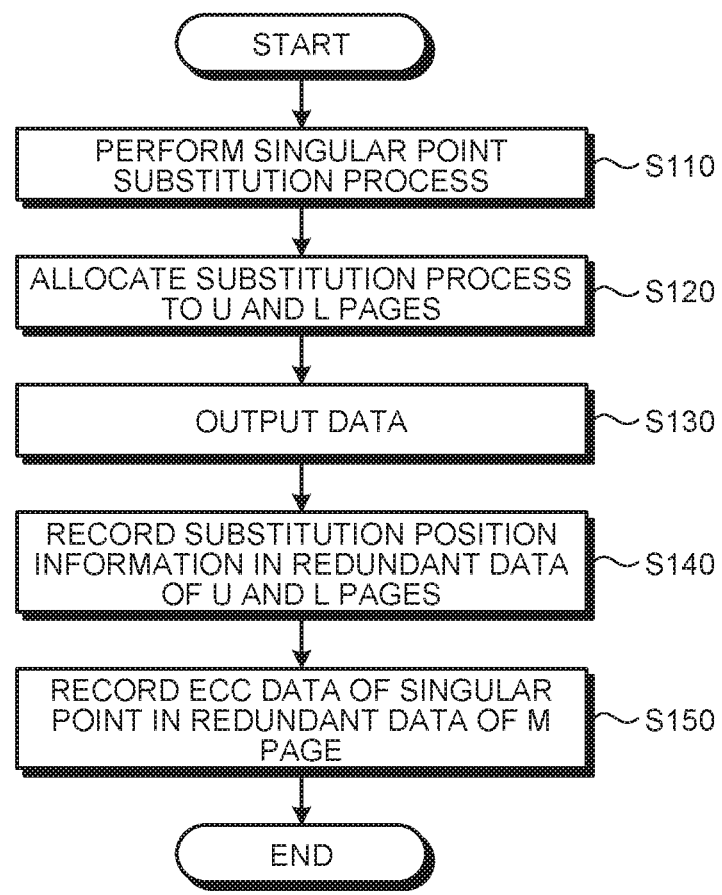
FIG. 9 is a flowchart illustrating the procedure of a singular point substitution process according to a second embodiment.

FIG. 9 is a flowchart illustrating the procedure of the singular point substitution process according to the second embodiment. In the process illustrated in FIG. 9, the description of the same steps as those in the memory system 100A according to the first embodiment illustrated in FIG. 6 will not be repeated.

When a data write request is received from a host 1, a conversion unit 50A divides data input from the host 1 into frames. In addition, the conversion unit 50A extracts a singular point from the data input from the host 1. Then, the conversion unit 50A performs a substitution process for the extracted singular point (Step S110). In this case, the conversion unit 50A performs a certain percentage of the substitution process, which is bit inversion, to each of the U page and the L page. For example, the conversion unit 50A performs the substitution process corresponding to one fifth of all of the singular points to each of the U page and the L page. In other words, the conversion unit 50A performs the substitution process corresponding to one fifth of all of the singular points to the U page, performs the substitution process corresponding to one fifth of all of the singular points to the L page, and does not perform the substitution process to the M page (Step S120). In this way, the substitution process is not performed for three-fifths of the singular points. The conversion unit 50A inverts the bits of the U page and the L page at the singular points at a ratio of the substitution process.

Then, the conversion unit 50A generates substitution position information indicating the position where bit inversion has been performed. Then, the conversion unit 50A outputs the data (both data to be substituted and data which is not to be substituted) subjected to the substitution process and the substitution position information to an ECC unit 60 (Step S130).

The ECC unit 60 performs an error correction coding process for the data transmitted from the conversion unit 50A to generate ECC data. In this embodiment, the ECC unit 60 performs ECC for singular points which cause bit errors among three-fifths of the singular points which have not been allocated to the U page and the L page. For example, it is assumed that 35% ($\approx 1/3$) of the singular points cause bit errors. In this case, the ECC unit 60 processes about one fifth (=(3/5)×35%) of the singular points using ECC. In this way, bit errors corresponding to about one fifth of all of the singular points are corrected by ECC.

The length of the frame capable of reducing both the substitution position information and the ECC data of the singular point is set in the memory system 100A in advance. In addition, the percentage of the substitution process performed to the U page and the L page is set in the memory system 100A in advance, on the basis of the estimated number of singular points corresponding to the frame length and the bit error rate of the singular point. As such, in the memory system 100A, the singular point substitution process and the ECC process are optimally allocated.

In the memory system 100A, the conversion unit 50A performs the substitution process for a predetermined frame. In this case, the conversion unit 50A performs the substitution process to the U page and the L page at a predetermined percentage. Then, the ECC unit 60 performs an ECC process for the bit errors caused by the singular points which have not been subjected to the substitution process.

The ECC unit 60 inputs the coded data, the substitution position information, and the ECC data to a memory I/F 4. The conversion unit 50A may input to the substitution position information to the memory I/F 4.

The memory I/F 4 writes the data, the substitution position information, and the ECC data from the ECC unit 60 to each page of a NAND 10. In this case, the memory I/F 4 records the data converted (subjected to the substitution process) by the conversion unit 50A at the head of the page. In addition, the memory I/F 4 records the substitution position information as a portion of redundant data in a tail end region of a data string of each of the U page and the L page (Step S140).

The memory I/F 4 records the ECC data of each page as a portion of the redundant data in a tail end region of the data string in each page. In this way, ECC data 66M of the singular point is recorded as a portion of redundant data 61C in the tail end region of the data string in the M page (Step S150). The substitution position information may be stored in a region other than the tail end region.

Figure 10:
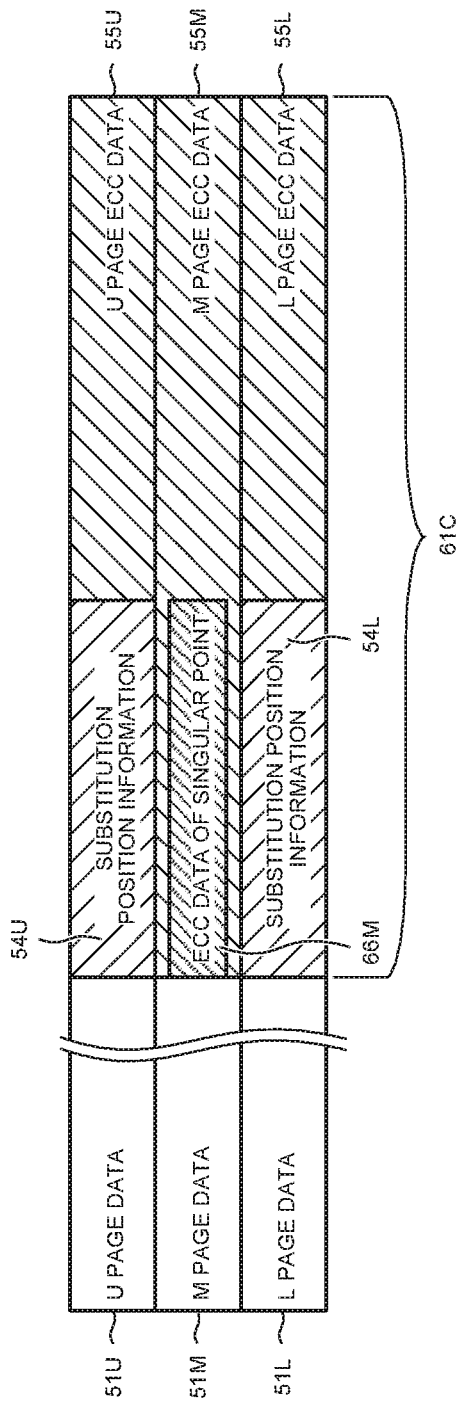
FIG. 10 is a diagram illustrating an example of the structure of pages according to the second embodiment.

FIG. 10 is a diagram illustrating an example of the structure of pages according to the second embodiment. U page data 51U, substitution position information 54U of the U page, and U page ECC data 55U are written to the U page of the NAND 10. In addition, L page data 51L, substitution position information 54L of the L page, and L page ECC data 55L are written to the L page of the NAND 10. Furthermore, M page data 51M and M page ECC data 55M are written to the M page of the NAND 10. The M page ECC data 55M includes the ECC data 66M of the singular point. The ECC data 66M of the singular point is ECC data for a singular point which causes a bit error among three-fifths of the singular points.

The redundant data 61C is placed at the tail end of each page. In this embodiment, the substitution position information items 54U and 54L, the U page ECC data 55U, the M page ECC data 55M, and the L page ECC data 55L are written to the redundant data 61C. Specifically, the substitution position information 54U and the U page ECC data 55U are recorded in a region in which the redundant data 61C is placed in the U page. In addition, the M page ECC data 55M is recorded in a region in which the redundant data 61C is placed in the M page. The ECC data 66M of the singular point is included in the M page ECC data 55M. The substitution position information 54L and the L page ECC data 55L are recorded in a region in which the redundant data 61C is placed in the L page.

As such, the substitution position information items 54U and 54L having the number of bits corresponding to one fifth of all of the singular points are allocated to the redundant data 61C of the U page and the L page, respectively, and error correction capability corresponding to about 35% of the remaining three-fifths of the singular points is consumed as the ECC data 66M of the singular point in the M page. In this way, the size of the redundant data 61C used in the substitution position information and the size of the redundant data 61C which is allocated in order to perform error correction for the remaining singular points are substantially equal to each other in the U, M, and L pages. Therefore, it is possible to effectively take measures for the singular point.

As such, in this embodiment, the substitution position information 54U of the U page, the substitution position information 54L of the L page, and the ECC data 66M of the singular point are set so as to have substantially the same size. Therefore, the consumption of the redundant data 61C is suppressed. ECC data for the U page and the L page is reduced by an amount corresponding to one fifth of the number of singular points. However, since singular point substitution is not performed for the M page, ECC data is not reduced. Therefore, ECC codes in the U page and L page are different encoding rate from that in the M page.

As such, the memory system 100A substitutes some of the singular points with substitute codes and performs an ECC process for the remaining singular points, thereby suppressing the occurrence of a read error while suppressing the consumption of the redundant data 61C. Therefore, it is possible to effectively prevent the deterioration of error correction capability caused by the Er to A phenomenon. In addition, even if the frequency of occurrence of a read error caused by the Er to A phenomenon is increased by the wear of the NAND 10, it is possible to maintain error correction capability. In addition, parameters are dynamically changed, depending on the degree of wear of the NAND 10, which makes it possible to increase the lifespan of the NAND 10.

In this embodiment, for example, the distribution ratio (the ratio of the singular points) of the singular point substitution process for the U page, the singular point substitution process for the L page, and the ECC process for the singular points which are not to be subjected to the singular point substitution process in the M page is 1:1:3. The ratio of 1:1:3 is obtained on the assumption that the probability of the singular point causing the Er to A error is 35%. Therefore, in a case in which the wear of the NAND 10 progresses and the error rate increases, when the state of the NAND 10 changes, other distribution ratios (ratios) may be used. For example, when the Er to A error reaches 50%, the distribution rate is changed to 1:1:2. In this case, it is possible to effectively perform error correction. As such, the memory system 100A may dynamically change an appropriate distribution rate (process parameter), depending on the degree of wear of the NAND 10.

According to the second embodiment, the substitution process which inverts the bits of the U page and the L page is performed for a certain percentage of the singular points. Then, the singular points which cause bit errors among the remaining singular points are corrected by ECC. The singular point substitution process and the ECC process are optimally allocated such that the same amount of redundant data 61C for the singular point is consumed in each page. Therefore, it is possible to reduce the number of read errors caused by the Er to A phenomenon while suppressing the consumption of the amount of redundant data 61C used to restore data in the NAND 10.

Third Embodiment

Next, a third embodiment will be described with reference to FIGS. 11 to 18. In the third embodiment, bit inversion is performed using error suppression coding such that the number of singular points is reduced and the singular point substitution process used in the first or second embodiment is performed.

A conversion unit 50A according to this embodiment divides a data string into a plurality of frames and attempts to invert bits of each of an U page, an M page, and an L page in each frame. Then, the conversion unit 50A selects an inversion method in which the number of singular points is the minimum among the bit-inverted frames. When the number of singular points is the minimum in a frame before bit inversion, the frame before bit inversion is selected. In this embodiment, a process that selects an inversion method in which the number of singular points is the minimum after a bit inversion process is referred to as an error suppression coding process. The conversion unit 50A performs the singular point substitution process used in the first or second embodiment for the frame in which the number of singular points has been minimized by the error suppression coding process. Hereinafter, a case in which the conversion unit 50A performs the substitution process for the extracted singular point using the same method as that in the second embodiment will be described.

Figure 11:
FIG. 11 is a diagram illustrating an error suppression coding process.

Here, the error suppression coding process will be described. FIG. 11 is a diagram illustrating the error suppression coding process. The conversion unit 50A divides a data string corresponding to a write request from a host 1 into a plurality of frames. In addition, the conversion unit 50A inverts bits of the U page, the M page, and the L page in each of the divided frames. Then, the conversion unit 50A selects a frame in which the number of singular points is the minimum from the bit-inverted frames. The conversion unit 50A applies the bit inversion method of the selected frame.

The conversion unit 50A performs seven bit inversion processes, that is, U inversion, M inversion, L inversion, UM inversion, UL inversion, ML inversion, and UML inversion. The U inversion inverts the U page. The M inversion inverts the M page. The L inversion inverts the L page. The UM inversion inverts the U page and the M page. The UL inversion inverts the U page and the L page. The ML inversion inverts the M page and the L page. The UML inversion inverts the U page, the M page, and the L page. In addition, a candidate of the frame is the original frame (ORG) in which bits are not inverted by the conversion unit 50A. Therefore, a total of eight candidates of the frame are considered.

For example, when the original frame (ORG) is "C", "C" is changed to "B" by the U inversion, is changed to "F" by the M inversion, and is changed to "D" by the L inversion. In addition, "C" is changed to "G" by the UM inversion, is changed to "A" by the UL inversion, is changed to "E" by the ML inversion, and is changed to "Er" by the UML inversion.

For example, when the data arrangement of the original frame (ORG) is "C-A-G-Er-G-A-D-C-D", the data arrangement is inverted to the following data string by the following inversion:

U inversion . . . "B-D-F-E-F-D-A-B-A";
M inversion . . . "F-Er-B-A-B-Er-E-F-E";
L inversion . . . "D-B-Er-G-Er-B-C-D-C";
UM inversion . . . "G-E-C-D-C-E-Er-G-Er";
UL inversion . . . "A-C-E-F-E-C-B-A-B";
ML inversion . . . "E-G-A-B-A-G-F-E-F"; and
UL inversion . . . "Er-F-D-C-D-F-G-Er-G".

In the original frame (ORG), the position of Er in "G-Er-G" is a singular point. The generation of the singular point is avoided by the U inversion, the M inversion, the L inversion, the UL inversion, and the ML inversion. In addition, in the UM inversion, the position of Er in "E-Er-G" is a new singular point. In the UML inversion, the position of Er in "G-Er-G" is a new singular point.

The conversion unit 50A selects a code sequence having a small number of singular points from each data arrangement. The conversion unit 50A can select a code sequence having a small number of singular points from eight types of frames, using the error suppression coding process. Therefore, the conversion unit 50A is likely to select a frame having a smaller number of singular points than the original frame (ORG). When there is no frame having a smaller number of singular points than the original frame even though bit inversion is used, the conversion unit 50A selects the original frame.

For example, in the example illustrated in FIG. 11, the singular points are removed by the U inversion, the M inversion, the L inversion, the UL inversion, and the ML inversion. Therefore, the conversion unit 50A selects a code sequence in which bits have been inverted by any one of the U inversion, the M inversion, the L inversion, the UL inversion, and the ML inversion.

However, the singular point is likely to remain in the data string even if bit inversion is performed. In other words, in some cases, even if eight types of bit inversion are performed, the singular points remain in all of the frames. At the remaining singular points, bit errors are concentrated on the M page due to errors caused by the Er to A phenomenon. As such, the number of singular points is expected to be significantly reduced by the error suppression coding process. However, the bit errors caused by the residual singular points are concentrated on the M page. Therefore, the conversion unit 50A substitutes the singular points which have not been removed by the error suppression coding process with substitute codes.

Figure 12:
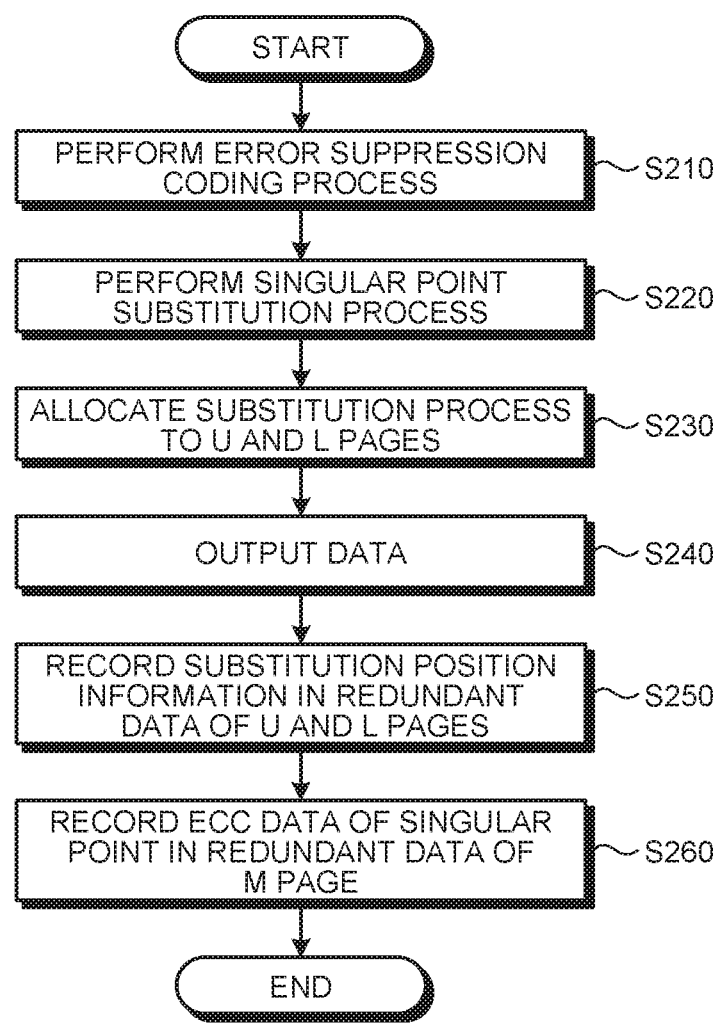
FIG. 12 is a flowchart illustrating the procedure of a singular point substitution process according to a third embodiment.

FIG. 12 is a flowchart illustrating the procedure of the singular point substitution process according to the third embodiment. In the process illustrated in FIG. 12, the description of the same steps as those in the memory system 100A according to the second embodiment illustrated in FIG. 6 will not be repeated.

When a data write request is received from the host 1, the conversion unit 50A divides data input from the host 1 into frames. In addition, the conversion unit 50A performs the error suppression coding process for each frame. Specifically, the conversion unit 50A performs the above-mentioned seven bit inversion processes for data strings of the frames. Then, the conversion unit 50A selects a frame having the smaller number of singular points from a total of eight frames including the frame which has not been subjected to bit inversion and the seven frames which have been subjected to bit inversion (Step S210).

The conversion unit 50A allocates a bit inversion flag corresponding to one symbol to each frame and records information indicating which of the bit strings of the U page, the M page, and the L page is inverted in a bit of the bit inversion flag of the corresponding page. In other words, information indicating which of the U inversion, the M inversion, the L inversion, the UL inversion, the ML inversion, the UM inversion, the UML inversion, and no inversion has been performed is recorded in the bit inversion flag of each page. For example, when the U inversion has been performed, data indicating inversion is recorded in the bit inversion flag of the U page and data indicating no inversion is recorded in the bit inversion flags of the M page and the L page.

The conversion unit 50A may place a symbol, which is the bit inversion flag, as a portion of redundant data at the tail end of the data string. In this case, the conversion unit 50A allocates a portion of the redundant data which is additionally provided for ECC to the bit inversion flag.

Figure 13:
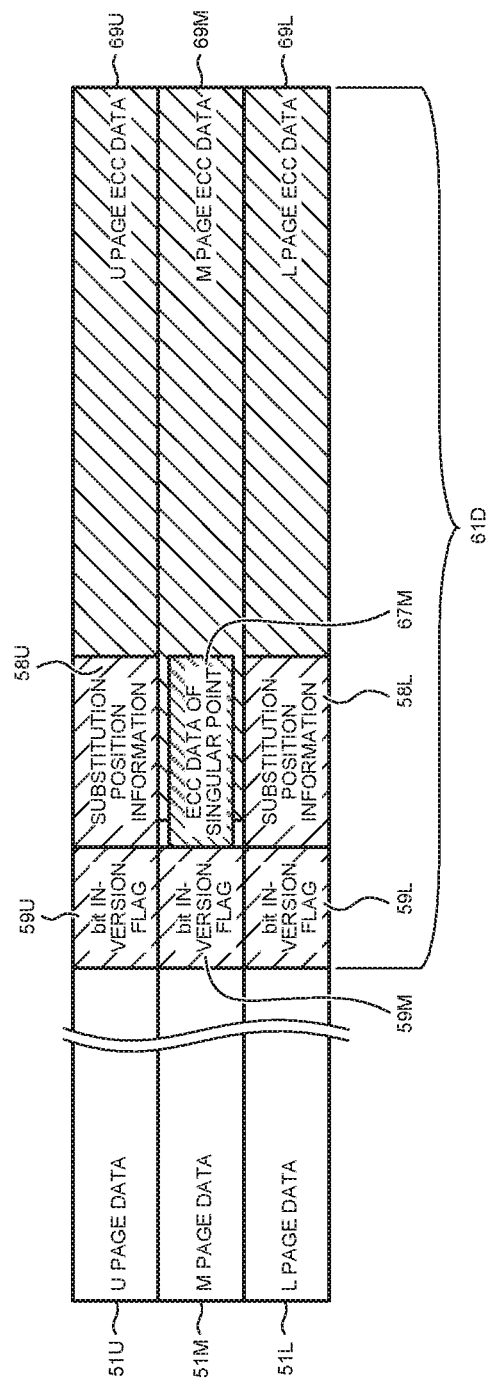
FIG. 13 is a diagram illustrating an example of the structure of pages according to the third embodiment.

FIG. 13 is a diagram illustrating an example of the structure of pages according to the third embodiment. U page data 51U, a bit inversion flag 59U of the U page, substitution position information 58U of the U page, and U page ECC data 69U are written to the U page of the NAND 10. In addition, M page data 51M, a bit inversion flag 59M of the M page, and M page ECC data 69M are written to the M page of the NAND 10. The M page ECC data 69M includes ECC data 67M of a singular point. The ECC data 67M of the singular point is ECC data for a singular point which causes a bit error among the remaining singular points allocated to the substitution position information items 58U and 58L. In addition, L page data 51L, a bit inversion flag 59L of the L page, substitution position information 58L of the L page, and L page ECC data 69L are written to the L page of the NAND 10.

Redundant data 61D is placed at the tail end of each page. In this embodiment, the bit inversion flags 59U, 59M, and 59L, the substitution position information items 58U and 58L, the U page ECC data 69U, the M page ECC data 69M, and the L page ECC data 69L are written to the redundant data 61D. Specifically, the bit inversion flag 59U, the substitution position information 58U, and the U page ECC data 69U are recorded in a region in which the redundant data 61D is placed in the U page. In addition, the bit inversion flag 59M and the M page ECC data 69M are recorded in a region in which the redundant data 61D is placed in the M page. The ECC data 67M of the singular point is included in the M page ECC data 69M. Furthermore, the bit inversion flag 59L, the substitution position information 58L, and the L page ECC data 69L are recorded in a region in which the redundant data 61D is placed in the L page.

The conversion unit 50A extracts a singular point from the data string of the frame which is selected from eight frames. In this case, when no singular point remains, the singular point substitution process is not performed.

When a singular point remains, the conversion unit 50A performs the substitution process for the extracted singular point, using the same method as that in the second embodiment (Step S220). Specifically, the conversion unit 50A performs a certain percentage of the substitution process, which is bit inversion, to each of the U page and the L page (Step S230).

Then, the conversion unit 50A generates substitution position information indicating the position where bit inversion has been performed. Then, the conversion unit 50A outputs the data (both data to be substituted and data which is not to be substituted) subjected to the substitution process, the substitution position information, and the bit inversion flag to the ECC unit 60 (Step S240).

The ECC unit 60 performs an error correction coding process for the data transmitted from the conversion unit 50A to generate ECC data. The ECC unit 60 inputs the coded data, the substitution position information, and the ECC data to the memory I/F 4. In addition, the conversion unit 50A may input at least one of the substitution position information and the bit inversion flag to the memory I/F 4.

The memory I/F 4 writes the data, the bit inversion flag, the substitution position information, and the ECC data transmitted from the ECC unit 60 to each page of the NAND 10. In this case, the memory I/F 4 records the data converted (subjected to the substitution process) by the conversion unit 50A at the head of the page. In addition, the memory I/F 4 records the bit inversion flag as a portion of the redundant data in a tail end region of the data string of each page. The memory I/F 4 records the substitution position information as a portion of the redundant data in a tail end region of the data string of each of the U page and the L page (Step S250).

Furthermore, the memory I/F 4 records the ECC data of each page as a portion of the redundant data in the tail end region of the data string of each page. In this way, the ECC data of the singular point is recorded as a portion of the redundant data in the tail end region of the data string of the M page (Step S260). At least one of the bit inversion flag and the substitution position information may be stored in a region other than the tail end region.

Here, the effect of the frame inversion by the error suppression coding process will be described. As described above, the number of types of symbol strings is 512 (=8× 8×8). As described above, there are seven singular points, that is, G-Er-G, G-Er-F, F-Er-G, G-Er-E, F-Er-F, E-Er-G, and G-A-G. Therefore, the probability of the singular point being appeared is 7/512 and the estimated number of singular points appeared is 56 among 4096 symbols. When all of the data strings are divided into N frames, the number of necessary inversion flags is N symbols.

In a case in which the probability of the singular point causing the Er to A phenomenon is 35%, when the frame inversion process is not performed, the number of bit errors which occur in the M page is 19.6 bits (=4096×7/512×35%). The number of remaining singular points which are estimated when N is changed and the number of bit errors caused by this situation are calculated by a simulation under the above-mentioned conditions.

FIG. 14 is a diagram illustrating the relationship between the number of bits of the inversion flag and the number of bits consumed in ECC required for the bit errors at the residual singular points. FIG. 14 illustrates the relationship among a frame length (the number of bits), the size of the inversion flag (the number of bits), the number of singular points (remaining singular points) which remain even if the error suppression coding process is performed, the estimated number of bit errors, and the number of bits consumed in ECC for the estimated bit errors (the amount of data). In FIG. 14, the maximum number of residual singular points assumed according to a selected frame length is estimated with a probability of 99.9% from the simulation result.

For example, when the frame length is 64 symbols, the inversion flag requires 64 bits. In this case, even if the error suppression coding process is performed, seven singular points remain and the estimated number of bit errors is 2.45 bits. The number of bits consumed in ECC for the estimated bit errors is 36 bits.

The effect of suppressing the number of singular points where an error (Er to A error) occurs due to the Er to A phenomenon is obtained by the error suppression coding process. However, the effect depends on the frame length subjected to bit inversion. As the frame length decreases, the estimated number of residual singular points decreases and the number of necessary inversion flags increases. In addition, it is considered that the error correction capability of ECC is consumed by an amount corresponding to the estimated number of bit errors. Here, in order to specify the position (=syndrome) of the error bit, the number of bits consumed in ECC is calculated on the assumption that 12 bits, which is the minimum number of bits required, are used from a total data length of 4096 (2^12) bits.

A trade-off relationship is established between the number of inversion flags and the number of bits consumed in ECC. This simulation proved that the sum of the number of inversion flags and the number of bits consumed in ECC is the minimum when N is 64. Here, the sum is 100 bits (=64 bits (inversion flags)+36 bits (bits consumed in ECC).

As described above, when the frame inversion process is not performed by the error suppression coding process, an error of 19.6 bits is estimated. Therefore, when the error suppression coding process is not performed, it is considered that 240 redundant bits (=20 positions×12 bits) are consumed in ECC. Therefore, the number of bits consumed in ECC for errors caused by the Er to A phenomenon can be reduced by half or more by the error suppression coding process. When the number of remaining singular points is equal to or greater than an assumed value, it is considered that the error correction capability of ECC is consumed, similarly to the first embodiment.

In this embodiment, the conversion unit 50A performs the error suppression coding process and then performs the substitution process using the same method as that in the second embodiment. However, the conversion unit 50A may perform the error suppression coding process and then perform the substitution process using the same method as that in the first embodiment. In this case, the substitution position information is also stored in the M page. The structure of pages in this case will be described.

Figure 15:
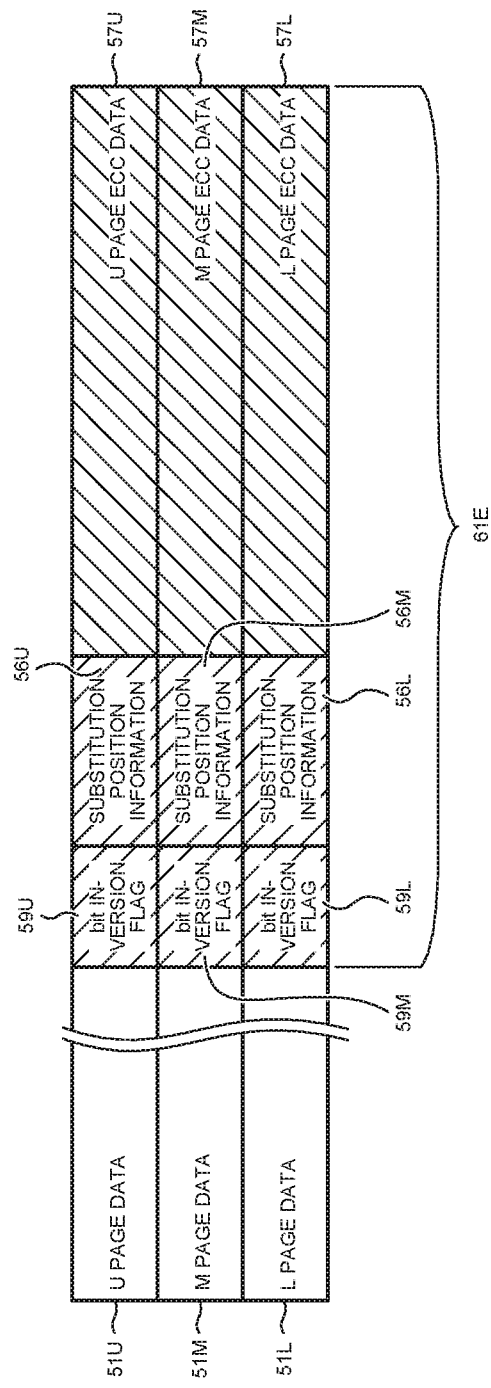
FIG. 15 is a diagram illustrating another example of the structure of pages according to the third embodiment.

FIG. 15 is a diagram illustrating another example of the structure of pages according to the third embodiment. U page data 51U, a bit inversion flag 59U of the U page, substitution position information 56U of the U page, and U page ECC data 57U are written to the U page of the NAND 10. In addition, M page data 51M, a bit inversion flag 59M of the M page, substitution position information 56M of the M page, and M page ECC data 57M are written to the M page of the NAND 10. Furthermore, L page data 51L, a bit inversion flag 59L of the L page, substitution position information 56L of the L page, and L page ECC data 57L are written to the L page of the NAND 10.

Redundant data 61E is placed at the tail end of each page. In this embodiment, the bit inversion flags 59U, 59M, and 59L, the substitution position information items 56U, 56M, and 56L, the U page ECC data 57U, the M page ECC data 57M, and the L page ECC data 57L are written to the redundant data 61E. Specifically, the bit inversion flag 59U, the substitution position information 56U, and the U page ECC data 57U are recorded in a region in which the redundant data 61E is placed in the U page. In addition, the bit inversion flag 59M, the substitution position information 56M, and the M page ECC data 57M are recorded in a region in which the redundant data 61E is placed in the M page. The bit inversion flag 59L, the substitution position information 56L, and the L page ECC data 57L are recorded in a region in which the redundant data 61E is placed in the L page.

Figure 16:
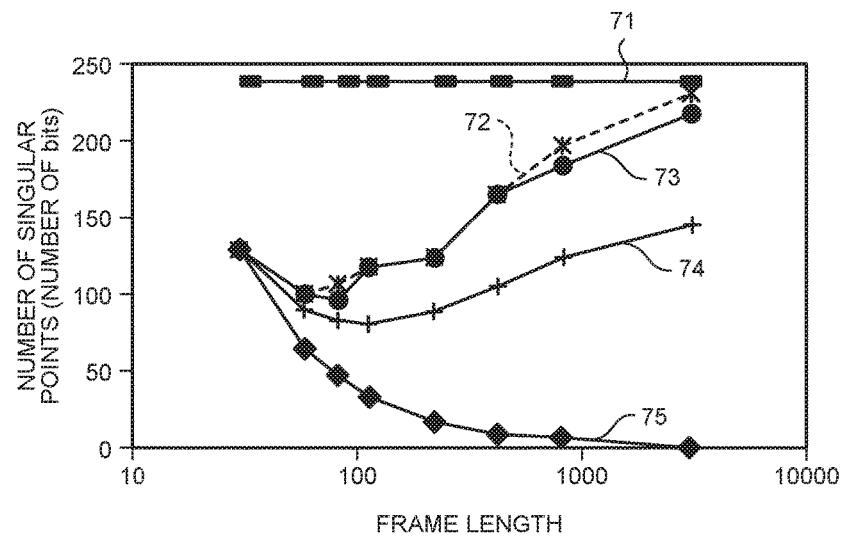
FIG. 16 is a diagram illustrating the relationship between a frame length and the number of singular points.

FIG. 16 is a diagram illustrating the relationship between a frame length and the number of singular points. In a graph illustrated in FIG. 16, the horizontal axis is the frame length and the vertical axis is the number of bits consumed in ECC for the singular point. A relationship 75 indicates the number of bits of the bit inversion flag. The vertical axis with respect to the relationship 75 indicates the number of bits used in the bit inversion flag.

A relationship 71 is a relationship when neither the error suppression coding process nor the singular point substitution process is performed. When neither the error suppression coding process nor the singular point substitution process is performed, 240 redundant bits are consumed in ECC, regardless of a frame length, as described above. As illustrated in the relationship 75, as the frame length increases, the number of frames is reduced and the number of bits of the bit inversion flag is reduced.

A relationship 72 is a relationship when the error suppression coding process is performed. A relationship 73 is a relationship when the error suppression coding process and the singular point substitution process according to the first embodiment are performed. A relationship 74 is a relationship when the error suppression coding process and the singular point substitution process according to the second embodiment are performed. The relationship 74 corresponds to the data string illustrated in FIG. 13. The relationship 73 corresponds to the data string illustrated in FIG. 15.

The relationships 72 to 74 are the sum of the number of bits of the bit inversion flag and the number of bits consumed in ECC. The number of bits consumed in ECC increases as the frame length increases. The number of bits of the bit inversion flag decreases as the frame length increases. Therefore, the relationships 72 to 74 have the minimum points. In this embodiment, the conversion unit 50A divides a data string so as to have the frame length as the minimum point. The division size (frame length) is set in the conversion unit 50A in advance.

As illustrated in FIG. 16, in the relationship 73, the number of bits consumed in ECC for the singular point is less than that in the relationship 72. In the relationship 74, the number of bits consumed in ECC for the singular point is less than that in the relationship 73.

In other words, when the error suppression coding process and the singular point substitution process according to the first embodiment are performed, the number of bits consumed in ECC for the singular point is less than that when the error suppression coding process is performed. Therefore, in the relationship 73, error correction capability is higher than that in the relationship 72.

When the error suppression coding process and the singular point substitution process according to the second embodiment are performed, the number of bits consumed in ECC for the singular point is less than that when the error suppression coding process and the singular point substitution process according to the first embodiment are performed. Therefore, in the relationship 74, error correction capability is higher than that in the relationship 73.

In the first and second embodiments, the conversion unit 50A is provided in the memory controller 2. However, the conversion unit 50A may be provided in other places. For example, a conversion unit having the same functions as the conversion unit 50A may be provided in the NAND 10. In addition, a conversion unit having the same functions as the conversion unit 50A may be provided in a region other than the memory controller 2 and the NAND 10.

Figure 17:
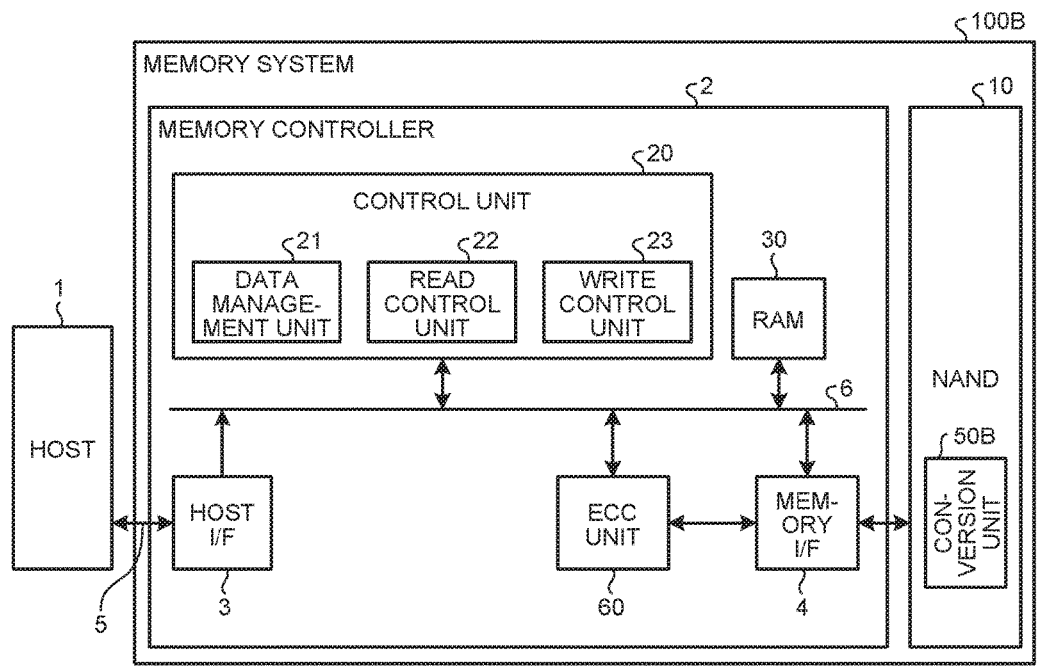
FIG. 17 is a functional block diagram illustrating the internal structure of a memory system in which a conversion unit is provided in a NAND.
Figure 18:
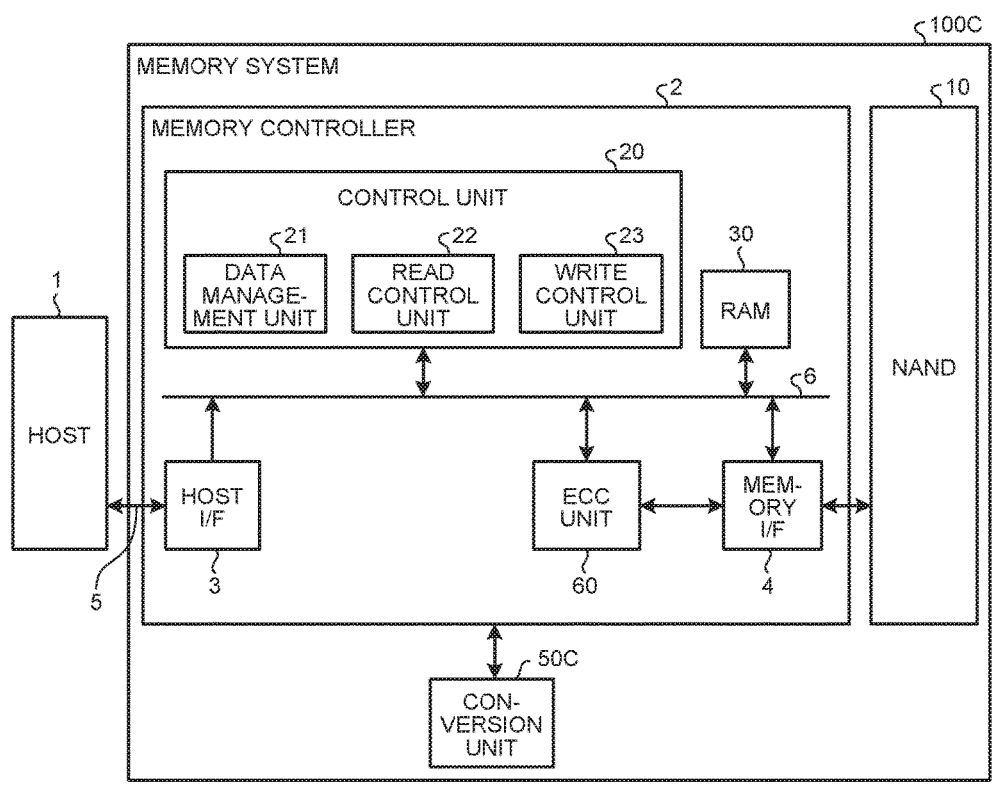
FIG. 18 is a functional block diagram illustrating the internal structure of a memory system in which a conversion unit is provided in a region other than a NAND and a memory controller.

FIG. 17 is a functional block diagram illustrating the internal structure of a memory system in which a conversion unit is provided in a NAND. FIG. 18 is a functional block diagram illustrating the internal structure of a memory system in which a conversion unit is provided in a region other than a NAND and a memory controller.

As illustrated in FIG. 17, a memory system 100B includes a memory controller 2 and a NAND 10. A conversion unit 50B having the same functions as the conversion unit 50A is provided in the NAND 10 of the memory system 100B.

As illustrated in FIG. 18, a memory system 100C includes a memory controller 2, a NAND 10, and a conversion unit 50C. The memory controller 2 and the conversion unit 50C are connected to each other. The memory systems 100B and 100C can achieve the same effect as the memory system 100A.

In the error suppression coding process, a bit inversion method which minimizes the number of singular points in the frame is selected. However, in this case, a new singular point is likely to be appeared due to the connection between consecutive frames. When a singular point is appeared due to the connection between the frames, the conversion unit 50A reexamines the inversion of any one of the consecutive frames and changes the bit inversion method to another combination of bit inversion processes (another bit inversion method) which minimizes the number of singular points. When there is no candidate of the bit inversion method which minimizes the number of singular points, the conversion unit 50A does not perform the reexamination process.

In this embodiment, the bit inversion flags 59U, 59M, and 59L or the substitution position information items 56U, 56M, and 56L (the substitution position information items 58U and 58L and the ECC data 67M of the singular point) are placed as a portion of the redundant data 61D (redundant data 61E) at the tail end of the data string. In this case, singular points are likely to be appeared in the bit inversion flags 59U, 59M, and 59L or the substitution position information items 56U, 56M, and 56L. Therefore, the conversion unit 50A may insert the symbol "C" or "D" into every two symbols (between two symbol sequences and two symbol sequences) in order to prevent the generation of singular points in the redundant data 61D or 61E. In this case, it is possible to prevent the generation of a new singular point.

According to the third embodiment, after bit inversion is performed by the error suppression coding process, the singular point substitution process is applied to the remaining singular points. Therefore, it is possible to reduce the number of read errors caused by the Er to A phenomenon while suppressing the consumption of the amount of redundant data 61D or 61E used to restore data in the NAND 10.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a non-volatile memory that includes memory cells which perform multi-value recording using a plurality of pages; and
   a controller that records data in the non-volatile memory, the controller performing bit inversion for any page of first symbols in a data string, dispersedly allocating bits to be inverted to the plurality of pages, and recording substitution position information indicating a position of the bit inversion in redundant data of the bit-inverted page in order to reduce a threshold voltage difference between two or more adjacent memory cells, the first symbols being data having a certain code sequence in the data string.

2. The memory system according to claim 1,
   wherein the controller equally allocates the bits to be inverted to the plurality of pages.

3. The memory system according to claim 1,
   wherein the memory cell includes three pages, that is, an upper page, a middle page, and a lower page, and
   the controller performs bit inversion for any one of the upper page, the middle page, and the lower page in the first symbol.

4. The memory system according to claim 3,
   wherein the controller performs bit inversion for the upper page and the lower page in a certain percentage of the first symbols and performs an error correction coding process for a second symbol which causes a bit error among the remaining the first symbols, the second symbol being data having a certain code sequence in the data string.

5. The memory system according to claim 4, wherein the controller performs bit inversion for the middle page in the second symbol.

6. The memory system according to claim 4, wherein the controller performs bit inversion for the upper page in one fifth of the first symbols and performs bit inversion for the lower page in one fifth of the first symbols.

7. The memory system according to claim 4, wherein the controller uses different methods in a first error correction coding in the upper page or the lower page and a second error correction coding in the middle page.

8. The memory system according to claim 4, wherein the substitution position information includes first substitution position information recorded in the upper page and second substitution position information recorded in the lower page, and
the controller performs the bit inversion process and the error correction coding process such that the first substitution position information, the second substitution position information, and error correction coding data generated by the error correction coding process for the second symbol have the same data size.

9. The memory system according to claim 1, wherein the first symbol is a symbol in which the probability of a read error occurring is greater than a certain value.

10. The memory system according to claim 3, wherein the controller performs the bit inversion process after performing an error suppression coding process, and
the error suppression coding process performs first bit inversion, second bit inversion, and third bit inversion for the upper page, the middle page, and the lower page in the data string, respectively, performs a combination of the first bit conversion, the second bit conversion, and the third bit conversion, and selects bit inversion which minimizes the number of first symbol from a data string obtained by the bit inversion.

11. The memory system according to claim 1, wherein, when a sequence in which the first symbols are consecutive in the data string is appeared, the controller performs bit inversion for any page in a third symbol which is interposed between the first symbols, the third symbol being data having a certain code sequence in the data string.

12. The memory system according to claim 1, wherein the first symbol corresponds to a distribution at the lowest distribution position among threshold voltage distributions in the multi-value recording, and
an error occurs due to the shift of the first symbol to a second symbol corresponding to a distribution at the second lowest distribution position, the second symbol being data having a certain code sequence in the data string.

13. The memory system according to claim 12, wherein the memory cell includes three pages, that is, an upper page, a middle page, and a lower page, and
the controller performs bit inversion for any one of the upper page, the middle page, and the lower page in the first symbol.

14. The memory system according to claim 1, wherein the controller inserts a third symbol which corresponds to a distribution at the third lowest distribution position or a fourth symbol which corresponds to a distribution at the fourth lowest distribution position among the threshold voltage distributions in the multi-value recording between two symbol sequences and two symbol sequences and records the substitution position information in the redundant data, the third symbol being data having a certain code sequence in the data string, the fourth symbol being data having a certain code sequence in the data string.

15. A memory control method comprising:
when multi-value data is recorded in memory cells of a non-volatile memory using a plurality of pages,
performing bit inversion for any page of first symbols in a data string, the first symbols being data having a certain code sequence in the data string,
dispersedly allocating bits to be inverted to the plurality of pages; and
recording substitution position information indicating a position of the bit inversion in redundant data of the bit-inverted page, in order to reduce a threshold voltage difference between two or more adjacent memory cells.

16. The memory control method according to claim 15, wherein the bits to be inverted are equally allocated to the plurality of pages.

17. The memory control method according to claim 15, wherein the memory cell includes three pages, that is, an upper page, a middle page, and a lower page, and
bit inversion is performed for any one of the upper page, the middle page, and the lower page in the first symbol.

18. The memory control method according to claim 17, wherein bit inversion is performed for the upper page and the lower page in a certain percentage of the first symbols, and
an error correction coding process is performed for a second symbol which causes a bit error among the remaining the first symbols, the second symbol being data having a certain code sequence in the data string.

19. The memory control method according to claim 18, wherein bit inversion is performed for the middle page in the second symbol.

20. The memory control method according to claim 18, wherein bit inversion is performed for the upper page in one fifth of the first symbols and is performed for the lower page in one fifth of the first symbols.

* * * * *